(12) United States Patent
Kim

(10) Patent No.: US 12,295,112 B2
(45) Date of Patent: May 6, 2025

(54) DISPLAY APPARATUS

(71) Applicant: LG Display Co., Ltd., Seoul (KR)

(72) Inventor: Minwoo Kim, Gumi-si (KR)

(73) Assignee: LG Display Co., Ltd., Seoul (KR)

(*) Notice: Subject to any disclaimer, the term of this patent is extended or adjusted under 35 U.S.C. 154(b) by 314 days.

(21) Appl. No.: 17/891,696

(22) Filed: Aug. 19, 2022

(65) Prior Publication Data

US 2023/0066876 A1 Mar. 2, 2023

(30) Foreign Application Priority Data

Aug. 30, 2021 (KR) .................... 10-2021-0114896

(51) Int. Cl.
*H05K 5/03* (2006.01)
*B32B 3/02* (2006.01)
*B32B 3/30* (2006.01)

(52) U.S. Cl.
CPC .............. *H05K 5/03* (2013.01); *B32B 3/02* (2013.01); *B32B 3/30* (2013.01); *B32B 2457/20* (2013.01)

(58) Field of Classification Search
CPC .... H05K 5/03; B32B 3/02; B32B 3/30; B32B 2457/20; G02F 1/133331; G02F 1/133305
See application file for complete search history.

(56) References Cited

U.S. PATENT DOCUMENTS

| 9,818,961 | B2* | 11/2017 | Hiroki ................. G09G 3/3266 |
| 10,257,945 | B2 | 4/2019 | Kim et al. |
| 10,789,863 | B2* | 9/2020 | Song ..................... H05K 1/189 |
| 10,827,630 | B2 | 11/2020 | Kim et al. |
| 2017/0318688 | A1 | 11/2017 | Kim et al. |
| 2019/0208650 | A1 | 7/2019 | Kim et al. |
| 2020/0004296 | A1* | 1/2020 | Lee ..................... G06F 1/1641 |
| 2020/0008308 | A1* | 1/2020 | Shin ....................... H05K 5/03 |
| 2020/0008309 | A1* | 1/2020 | Kim .................... H10K 59/873 |
| 2020/0170114 | A1* | 5/2020 | Choi ................... H05K 5/0017 |

FOREIGN PATENT DOCUMENTS

KR 10-2017-0124120 A 11/2017
KR 10-2020-0030207 A 3/2020

* cited by examiner

*Primary Examiner* — Anthony M Haughton
*Assistant Examiner* — Hung Q Dang
(74) *Attorney, Agent, or Firm* — Fenwick & West LLP

(57) ABSTRACT

A display apparatus includes a display portion comprising at least a portion that is deformable; and an apron comprising at least a portion that is deformable and a hollow space, the display portion disposed in the hollow space such that the apron surrounds an edge of the display portion, wherein the portion of the apron that is deformable has an unevenness portion in a surface of the apron, the unevenness portion disposed at positions of opposing edges of the display portion. Thus, a load of the apparatus is reduced, and an entire combined structure of the display portion and the apron is bent smoothly.

18 Claims, 10 Drawing Sheets

DISPLAY APPARATUS

CROSS-REFERENCE TO RELATED APPLICATION

This application claims priority under 35 U.S.C. 119(a) from Republic of Korea Patent Application No. 10-2021-0114896 filed on Aug. 30, 2021, which is incorporated by reference in its entirety.

BACKGROUND

Technical Field

The present disclosure relates to a display apparatus, and more particularly, to a display apparatus having a structure with improved durability.

Description of the Related Art

As we enter a full-fledged information era, a display apparatus that visually expresses an electrical information signal has developed rapidly. In response thereto, various display apparatuses having excellent performance, thinness, light weight, and low power consumption have been developed.

The display apparatuses include a liquid crystal display apparatus (LCD), a quantum dot (QD) display apparatus, a field emission display apparatus (FED), an electro-wetting display apparatus (EWD), and an organic light-emitting display apparatus (OLED), etc.

The display apparatus is miniaturized so that the apparatus may be carried by a user. The display apparatus has been developed to be mounted on a movable apparatus such as a vehicle. Thus, the user may use the display apparatus on the vehicle more conveniently.

SUMMARY

For convenience of users, development of a display apparatus with a roll-up structure is active. The roll-up display apparatus and a display module included therein may be provided with a roll-up display portion having a flexible structure that is bent.

The roll-up display portion may have repetitive bending depending on its use. When deformation thereof due to the bending is repeated, the display portion may be damaged. Therefore, a display portion with repeated bending should have a structure that may increase durability of the display portion by suppressing damage caused by the repeated deformation.

For example, in the roll-up display apparatus, an apron may be attached thereto to guide bending of the display portion and to guide movement thereof. The apron may serve to maintain an unfolded state in which the display portion is unfolded.

Further, the apron may play a role in increasing the durability of the display portion by suppressing excessive deformation when the display portion made of a relatively thin-film is bent.

However, since the apron is thicker than the display portion is, a load of an entirety of the display apparatus may increase or an area occupied by a combined structure of the display portion and the apron may increase.

Therefore, it is required to manufacture the apron which protects the display portion while maintaining sufficient rigidity, thereby improving the durability of the display portion, and which is light in a load thereof, and has a smooth bent structure.

Therefore, a purpose of the present disclosure is to provide a display apparatus including an apron which improves durability of a display portion, has a light load, and has a smoothly bent structure.

Further, a purpose of the present disclosure is to provide a display apparatus having a structure in which a bezel of a display portion is formed using the apron instead of black ink.

Purposes of the present disclosure are not limited to the above-mentioned purpose. Other purposes and advantages of the present disclosure that are not mentioned may be understood based on following descriptions, and may be more clearly understood based on embodiments of the present disclosure. Further, it will be easily understood that the purposes and advantages of the present disclosure may be realized using means shown in the claims and combinations thereof.

In one embodiment, a display apparatus comprises: a display portion comprising at least a portion that is deformable; and an apron comprising at least a portion that is deformable and a hollow space, the display portion disposed in the hollow space such that the apron surrounds an edge of the display portion, wherein the portion of the apron that is deformable has an unevenness portion in a surface of the apron, the unevenness portion disposed at positions of the apron corresponding to positions of opposing edges of the display portion.

In one embodiment, a display apparatus comprises: a display portion comprising at least a portion that is deformable; and an apron comprising at least a portion that is deformable and a hollow space, the display portion disposed in the hollow space such that the apron surrounds an edge of the display portion, wherein the apron includes: a pair of unevenness portions respectively disposed at positions of a surface of the apron corresponding to positions of both opposing edges of the display portion, the pair of unevenness portions spaced apart from each other in a second direction, wherein each of the unevenness portions from the pair extends in a first direction orthogonal that is to the second direction; and a pair of flattened portions respectively disposed at upper and lower edges of the display portion, wherein each of the flattened portions from the pair of flattened portions extends in the second direction orthogonal to the first direction.

In one embodiment, a display apparatus comprises: an apron including a plurality of first deformable portions disposed on opposite edges of a first surface of the apron that extend in a first direction, each of the plurality of first deformable portions including a plurality of first protrusions that protrude from the first surface of the apron and a plurality of first recesses in the first surface of the apron, each of the plurality of first recesses disposed between a pair of first protrusions from the plurality of first protrusions; and a display portion coupled to the apron, the display portion configured to display an image and including a portion that is configured to deform.

Due to the structure of the apron according to the present disclosure, a load of the apparatus may be reduced due to the formation of the hollow portion, compared to a case in which the apron has a plate-shaped structure that is attached to an entirety of the rear face of the display portion and entirely screens the rear face of the display portion. Further, an entire combined structure of the display portion and the apron may be bent smoothly.

Further, due to this structure, an area of the apron having a larger thickness may be significantly reduced. Thus, when the apron moves with respect to a housing, the thick apron may be effectively prevented from interfering with other structures of the display apparatus. Thus, performance of the display apparatus may be improved.

Further, since the bezel is made of the apron instead of the black ink in the display apparatus, the black ink may be removed from the display apparatus. For this reason, the formation of the voids at the edge of the black ink when the bezel is made of the black ink may be suppressed. Accordingly, the quality of the display apparatus may be improved.

Further, in the display apparatus according to the present disclosure, the rigidity of the apron may be enhanced by the first protrusions, the second protrusions and the metal sheet. Therefore, even when the apron is repeatedly bent, damage thereto is suppressed due to this reinforcing structure. Thus, durability of the display apparatus may be improved.

Effects of the present disclosure are not limited to the above-mentioned effects, and other effects as not mentioned will be clearly understood by those skilled in the art from following descriptions.

The purposes, solutions, and effects of the disclosure as described above does not specify essential features of claims. Thus, the scope of claims is not limited by the purposes, solutions, and effects of the disclosure as described above.

DETAILED DESCRIPTION

Figure 1:
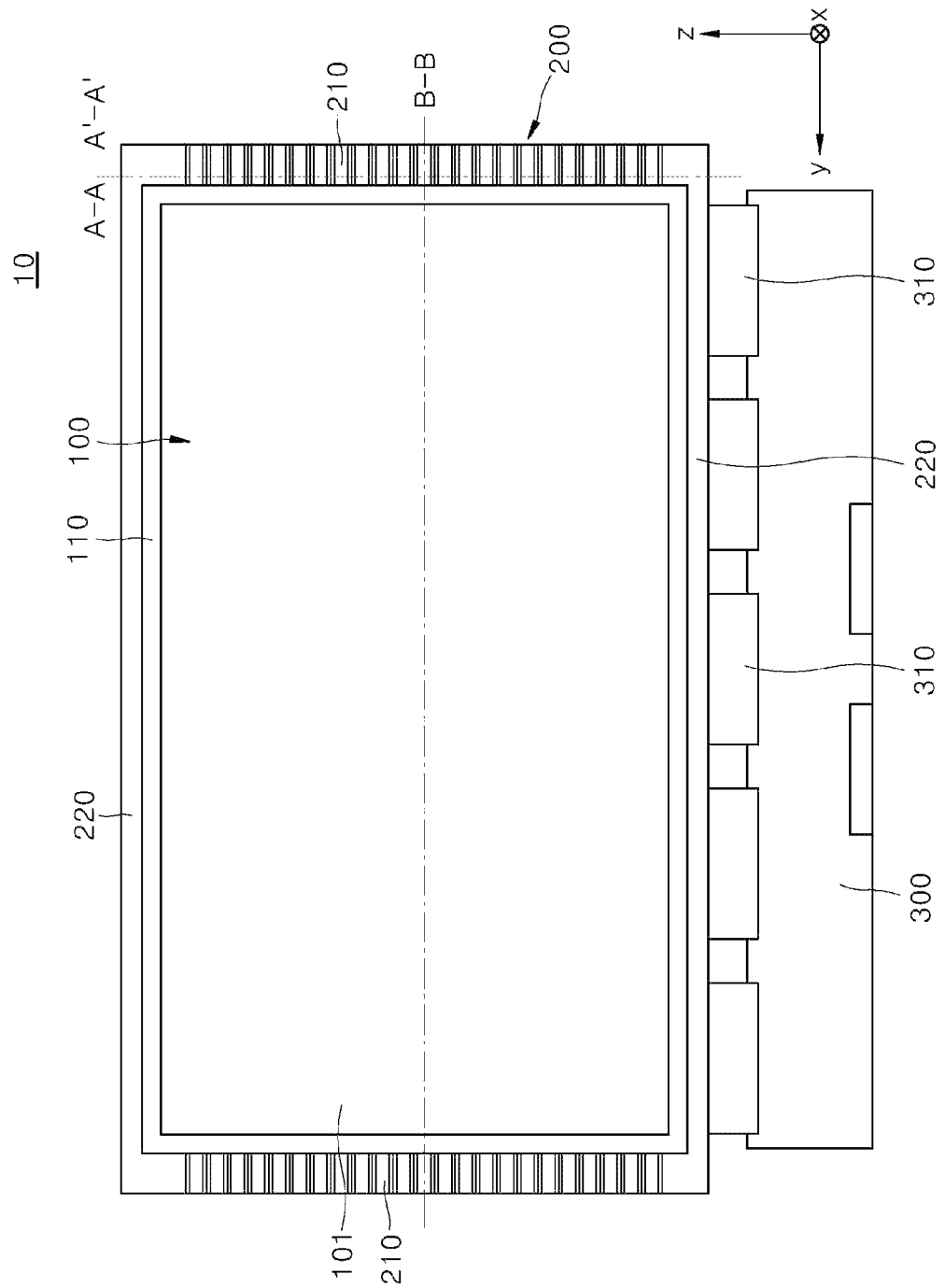
FIG. 1 is a front view showing a display module according to an embodiment.

Advantages and features of the present disclosure, and how to achieve them will become apparent with reference to the embodiments described below in detail in conjunction with the accompanying drawings. However, the present disclosure is not limited to the embodiments as disclosed below, but will be implemented in a variety of different forms. Only these embodiments make the present disclosure complete, and are constructed to fully inform those having common knowledge in the technical field to which the present disclosure belongs of a scope of the disclosure. The scope of the present disclosure is only defined by the scope of the claims.

A shape, a size, a ratio, an angle, a number, etc. disclosed in the drawings for illustrating embodiments of the present disclosure are exemplary, and the present disclosure is not limited thereto. The same reference numerals refer to the same elements herein. Further, in describing the present disclosure, when it is determined that a detailed description of a related known element may unnecessarily obscure gist of the present disclosure, the detailed description thereof will be omitted. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof.

In interpreting a numerical value, the value is interpreted as including an error range unless there is no separate explicit description thereof.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present. In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is not indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In descriptions of temporal relationships, for example, temporal precedent relationships between two events such as "after", "subsequent to", "before", etc., another event may occur therebetween unless "directly after", "directly subsequent" or "directly before" is not indicated. The features of the various embodiments of the present disclosure may be partially or entirely combined with each other, and may be technically associated with each other or operate with each other. The embodiments may be implemented independently of each other and may be implemented together in an association relationship. Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the apparatus in use or in operation, in addition to the orientation depicted in the figures. For example, when the apparatus in the drawings may be turned over, elements described as "below" or "beneath" or "under" other elements or features would then be oriented "above" the other elements or features. Thus, the example terms "below" and "under" may encompass both an orientation of above and below. The apparatus may be otherwise oriented for example, rotated 90 degrees or at other orientations, and the spatially relative descriptors used herein should be interpreted accordingly.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, a first direction refers to a vertical direction of a display apparatus in a state in which the display apparatus is installed for daily use. A second direction means a direction orthogonal to the first direction, and the third direction means a direction perpendicular to both the first direction and the second direction. Further, as used herein, a phare "move in the first direction" and a phrase "move up or down" may have the same meaning.

A Cartesian coordinate system may be used in drawings. In the Cartesian coordinate system, a z-axis direction represents the first direction, a y-axis direction represents the second direction, and an x-axis direction represents the third direction.

The display apparatus according to an embodiment may be mounted on a mobile apparatus such as a vehicle to provide convenience to a user. Hereinafter, a display apparatus mounted on a dashboard of the vehicle will be described by way of example.

The display apparatus according to an embodiment may include, for example, a liquid crystal display apparatus (LCD), a quantum dot (QD) display apparatus, a field emission display apparatus (FED), an electrowetting display apparatus (EWD), and an organic light-emitting display apparatus (OLED), etc. However, the present disclosure is not limited thereto.

Figure 2:
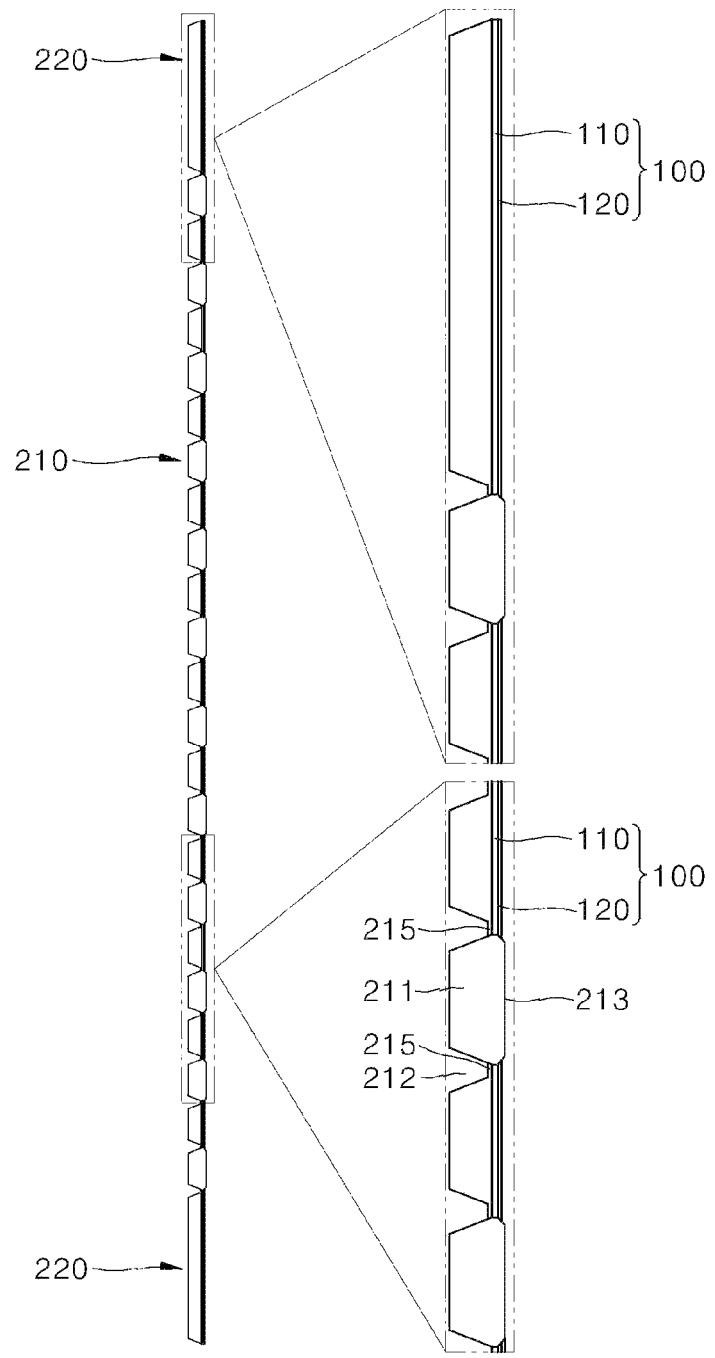
FIG. 2 is a side view showing a portion of a display module according to an embodiment.

FIG. 1 is a front view showing a display module 10 according to an embodiment. FIG. 2 is a side view showing a portion of a display module 10 according to an embodiment.

The display apparatus according to embodiment may include the display module 10. The display module 10 may include a display portion 100 and an apron 200. The display portion 100 may be constructed such that at least a portion thereof is deformable.

The display portion 100 and the apron 200 are constructed to be coupled to each other. The display portion 100 may be made of a flexible material in which at least portion of the display portion 100 is deformable. The apron 200 may be constructed so that at least a portion of the apron 200 is deformable, and may be combined with the display portion 100.

The apron 200 may have a structure in which at least a portion of the apron 200 is deformable so that at least a portion of the apron 200 may move integrally with the display portion 100. Each of the display portion 100 and the apron 200 may be constructed such that at least a portion thereof slides in the first direction. That is, each of the display portion 100 and the apron 200 may be constructed so that at least a portion moves up or down.

The display apparatus may include a housing 20 to accommodate therein at least a portion of the display portion 100 and at least a portion of the apron 200. When the display portion 100 and the apron 200 move downward, at least a portion of each of the display portion 100 and the apron 200 may be bent and deformed to a curved shape when viewed from a side and thus may be accommodated in the housing 20.

In this regard, the display portion 100 and the apron 200 may be constructed so that at least a portion thereof is wound around a rolling guide disposed in the display apparatus. Therefore, deformation of the display portion 100 and the apron 200 may occur continuously and repeatedly.

In one example, a protective film 101 for protecting the display portion 100 may be attached to a front face of the display portion 100. For example, the protective film 101 may be embodied as an anti-scattering film that prevents or at least reduces the display portion 100 from being broken and scattering due to external impact for user protection.

The display portion 100 may be formed in a plate shape, and may include a cover 110 and a panel 120 attached to a rear face of the cover 110 to reproduce an image or video. The light irradiating from the panel 120 may pass through the cover 110, and thus the cover 110 may be made of a transparent material.

In this regard, an area of the cover 110 may be larger than an area of the panel 120, so that an entirety of light emitting from the panel 120 may pass through the cover 110.

In addition, the display portion 100 may be formed in a structure in which a polarizer, a back plate irradiating light to the panel 120, and an adhesive layer for bonding the polarizer and the back plate to each other are stacked.

The display module 10 may further include a printed circuit board 300 having a driver circuit for controlling an operation of the display portion 100. The printed circuit board 300 may include a plurality of connectors 310 electrically connected to the display portion 100 and connecting the printed circuit board 300 and the display portion 100 to each other.

Various active elements, passive elements, and printed circuits constituting the driver circuit may be provided in the printed circuit board 300 and the connectors 310. In this regard, the driver circuit may be distributed over an entirety or a portion of the printed circuit board 300 and the connectors 310.

In one example, FIG. 1 shows an exploded view of the printed circuit board 300 and the connector 310 in an unfolded state. However, when the printed circuit board 300 is mounted in the housing 20, the connector 310 may be bent.

The apron 200 has a hollow portion and may be constructed to surround an edge of the display portion 100. That is, the apron 200 may have a structure similar to that of a window frame as a whole. The apron 200 may be attached to an edge of the display portion 100, and the display portion 100 may be disposed in the hollow portion of the apron 200.

Due to this structure, a load of the apparatus may be reduced due to the formation of the hollow portion, compared to a case in which the apron 200 has a plate-shaped structure that is attached to an entirety of the rear face of the display portion 100 and entirely screens the rear face of the display portion 100. Further, an entire combined structure of the display portion 100 and the apron 200 may be bent smoothly.

Further, due to this structure, an area of the apron 200 having a larger thickness may be significantly reduced. Thus, when the apron 200 moves with respect to the housing 20, the thicker portion of the apron 200 may be effectively prevented from interfering with other structures of the display apparatus. Thus, performance of the display apparatus may be improved.

The apron 200 may have an unevenness portion 210 formed in a position thereof corresponding to each of both opposite edges of the display portion 100. The unevenness portion 210 may be embodied as a pair of unevenness portions 210 respectively formed at positions on a front surface of the apron 200 corresponding to both opposite edges of the display portion 100. A length direction of the unevenness portion 210 is parallel to the first direction.

The unevenness portion 210 may be embodied as the pair of unevenness portions 210 arranged to be spaced apart from each other in a horizontal direction of the display portion 100, that is, the second direction orthogonal to the first direction. A plurality of irregularities or protrusions or recesses may be formed in the unevenness portion 210, and a length direction thereof may be parallel to the first direction.

The apron 200 may be made of a flexible material so as to be bent. However, the apron 200 may be formed to be relatively thicker compared to the display portion 100 in order to stably support and protect the display portion 100. Accordingly, forming the unevenness portion 210 in the apron 200 may allow the apron 200 to be smoothly bent.

The apron 200 may include a pair of flattened portions 220 having a length direction parallel to the second direction orthogonal to the first direction and respectively disposed at both opposite edges of the display portion 100 spaced from each other in the first direction. The pair of flattened portions 220 may be arranged to be spaced apart from each other in the first direction. In one embodiment, each flattened portion 220 corresponds to a non-deformable portion of the display module 10.

The pair of unevenness portions 210 and the pair of flattened portions 220 may be combined with each other to constitute the apron 200 in a window frame shape. In this regard, the unevenness portions 210 and the flattened portions 220 may be integrally formed with each other or may be monolithic. To protect the display portion 100, each of the unevenness portion 210 and the flattened portion 220 may be thicker than the display portion 100 may be.

In one example, the apron 200 may be attached to a front face of the cover 110 and may be disposed on the edge of the display portion 100. Accordingly, when the display apparatus is viewed from a front side, the unevenness portions 210 and the flattened portions 220 of the apron 200 may screen an edge of the cover 110, so that the apron 200 may serve as a bezel.

This bezel screens a bonding structure and other unnecessary structures located on the edge of the display portion 100 including the cover 110, so that the quality of the image or video reproduced on the display portion 100 may be improved, and an overall design quality of the display apparatus may be improved.

In the prior art, black ink constituting the bezel may be applied between the cover 110 and the panel 120. The bezel is formed. To this end, the black ink is applied to the edges of the cover 110 and the panel 120. At an edge of the black ink as a point where a boundary between the black ink, the cover 110 and the panel 120 is located, a void is formed due to a thickness of the black ink. The void may deteriorate the quality of the display apparatus.

In an embodiment, since the bezel is made of the apron 200 instead of the black ink in the display apparatus, the black ink may be removed from the display apparatus. Further, since the apron 200 is attached to the front face of the cover 110, a part or a material that causes the void is not disposed between the cover 110 and the panel 120. Therefore, no void is generated.

For this reason, the formation of the voids at the edge of the black ink when the bezel is made of the black ink may be suppressed. Accordingly, the quality of the display apparatus may be improved.

Figure 3:
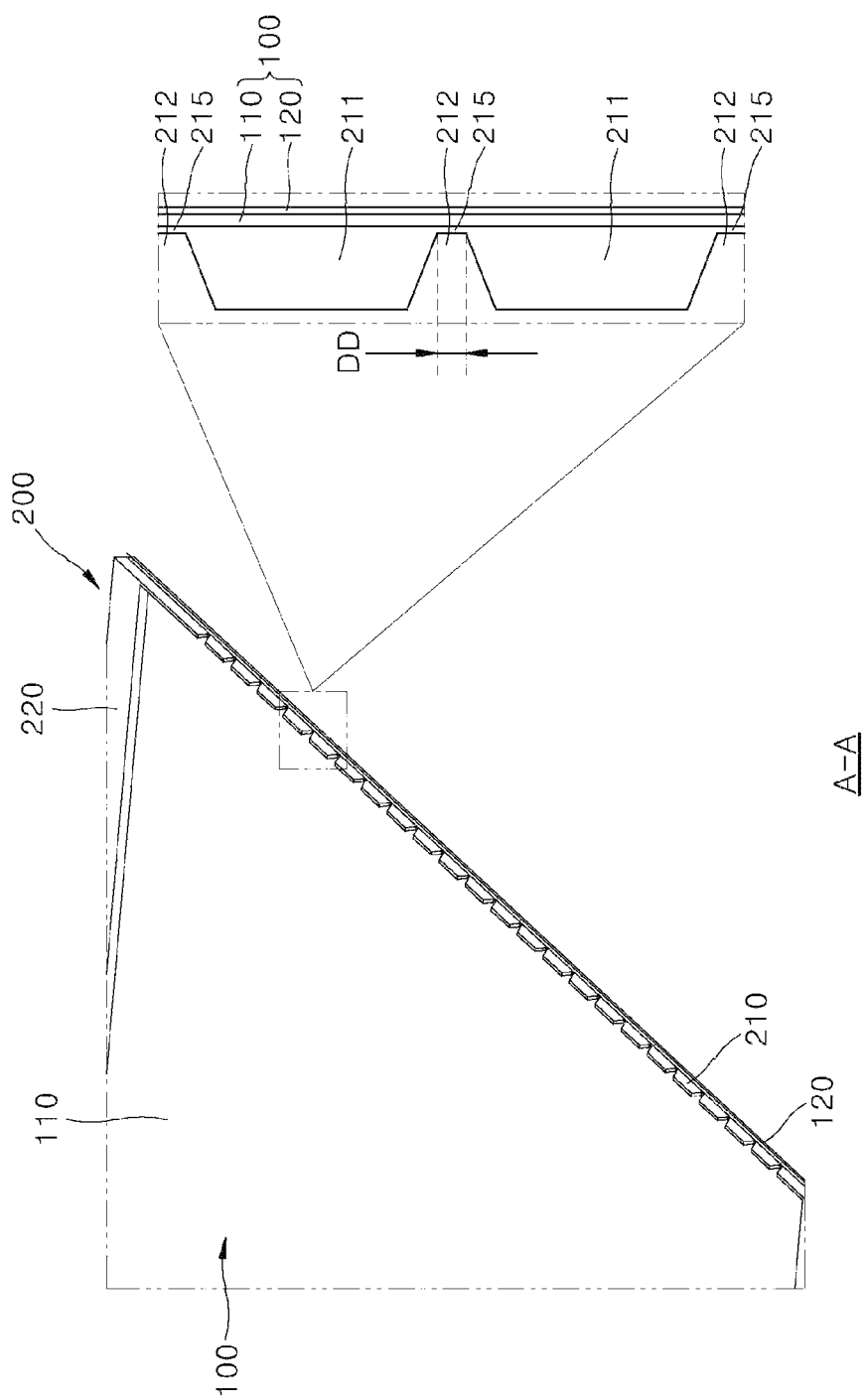
FIG. 3 is an enlarged view of a portion of a section A-A in FIG. 1 according to an embodiment.
Figure 4:
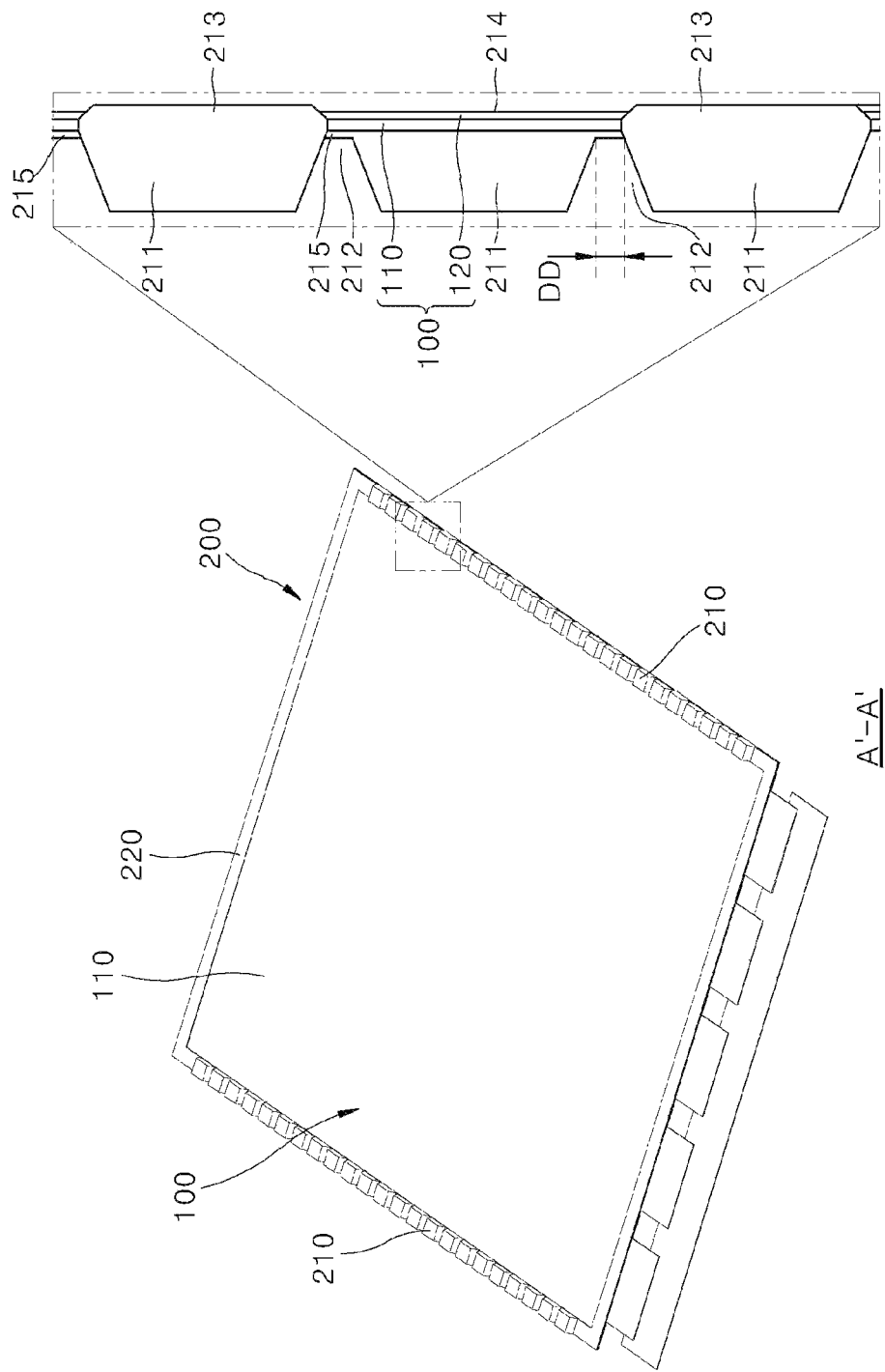
FIG. 4 is an enlarged view of a portion of a section A'-A' in FIG. 1 according to an embodiment.
Figure 5:
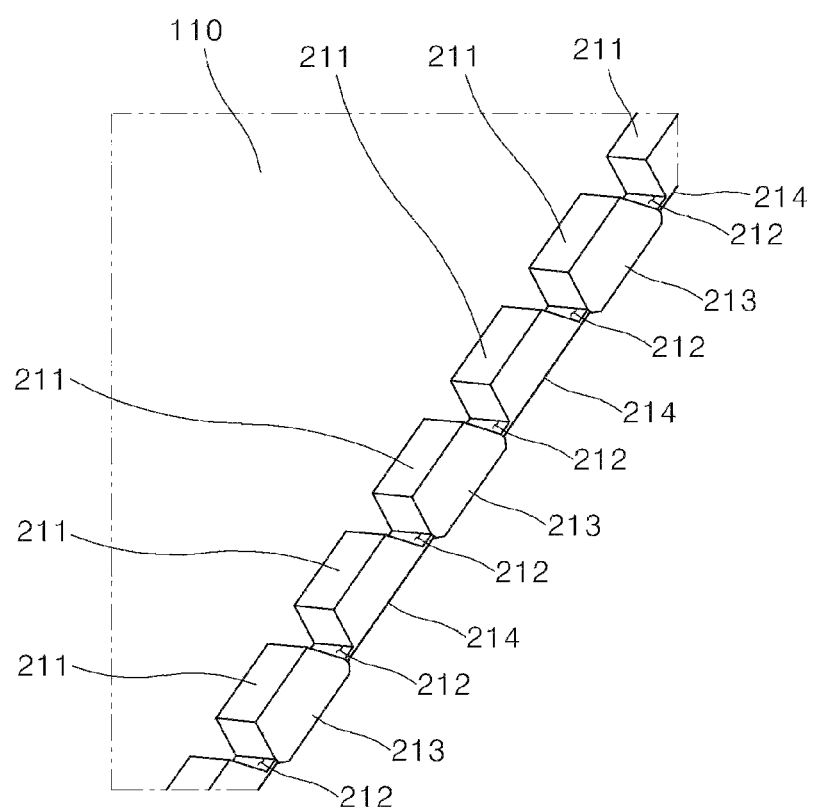
FIG. 5 is an enlarged view of a portion of a display module according to one embodiment.

FIG. 3 is an enlarged view of a portion of a section A-A in FIG. 1 according to an embodiment. FIG. 4 is an enlarged view of a portion of a section A'-A' in FIG. 1 according to an embodiment. FIG. 5 is an enlarged view of a portion of the display module 10 according to an embodiment.

The unevenness portion 210 may include a first protrusion 211 and a first recess 212 on a front surface of the apron 200. The first protrusion 211 may be constructed to protrude in a frontward of the display portion 100. A plurality of the first protrusions 211 may be arranged in the first direction. The first recess 212 may be disposed between adjacent ones (e.g., pairs) of the plurality of the first protrusions 211 and may space adjacent ones of the plurality of the first protrusions 211 from each other.

The first protrusion 211 may be formed to have a generally trapezoidal cross-section. A single first recess 212 is defined by neighboring first protrusions 211. Thus, the first recess 212 may also be formed to have a generally trapezoidal cross-section. Due to this structure, even when the apron 200 is bent, interference between the adjacent ones of the first protrusions 211 may be reduced or absent.

The first protrusions 211 may be arranged to be spaced apart from each other by a predetermined spacing. The unevenness portion 210 may include a connection cell 215 connecting adjacent first protrusions 211 to each other.

Two first protrusions 211 adjacent to each other and spaced apart from each other by the predetermined spacing may be connected to each other via the connection cell 215. Accordingly, a minimum separation distance between the neighboring first protrusions 211 may be the same as a length of the connection cell 215. In one example, the connection cell 215 may constitute a bottom face of the first recess 212.

Accordingly, a spacing DD between the adjacent first protrusions 211 is the same as the length of the connection cell 215. Thus, the apron 200 may continuously extend while the first protrusions 211 are connected to each other via the connection cells 215. The cover 110 may be attached to a rear face of the apron 200 composed of the first protrusions 211 and the connection cells 215 connected to each other via an adhesive. Thus, the display portion 100 may move integrally with the apron 200 and may be deformed integrally with the apron 200.

In this regard, when the apron 200 is bent, the connecting cell 215 may be deformed into a curved shape. When the apron 200 is bent, the first protrusions 211 are bent together, so that the spacing DD between the adjacent first protrusions 211 may be reduced.

The first protrusion 211 may be thicker than the connection cell 215 may be, and thus may serve to reinforce the rigidity of the apron 200 so as not to be damaged even when the apron 200 is repeatedly deformed.

When the apron 200 is bent, the spacing between the neighboring first protrusions 211 may be reduced. That is, the neighboring first protrusions 211 are arranged to be spaced apart from each other. Thus, even when the apron 200 is bent, the neighboring first protrusions 211 may not interfere with each other. Thus, the apron 200 may be smoothly bent.

Figure 6:
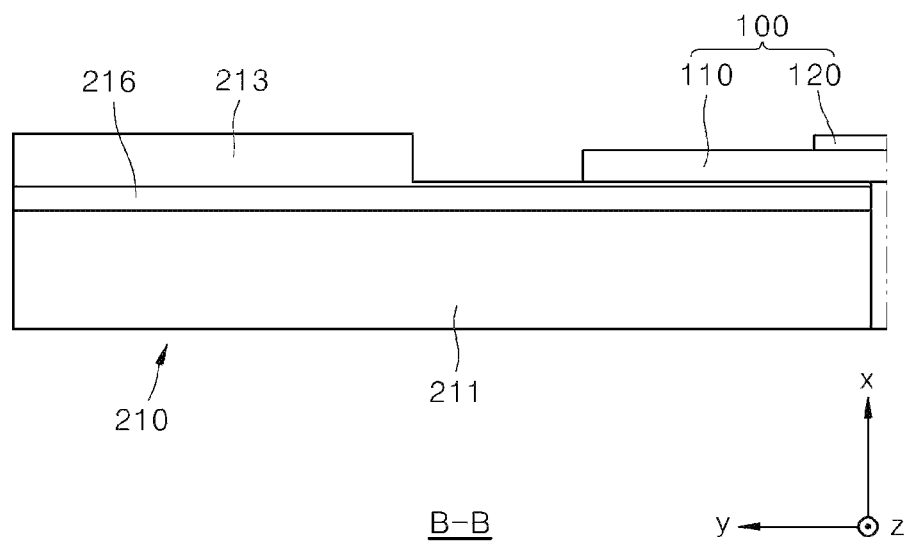
FIG. 6 is an enlarged view of a portion of a section B-B in FIG. 1 according to an embodiment.

FIG. 6 is an enlarged view of a portion of a section B-B in FIG. 1 according to an embodiment. The unevenness portion 210 may further include a metal sheet 216 formed in the unevenness portion 210 and extending in the first direction.

Further, the metal sheet 216 may be disposed inside the flattened portion 220. A length direction of the flattened portion 220 may be the second direction, such that the metal sheet 216 disposed in the flattened portion 220 may extend in the second direction.

In this regard, the metal sheet 216 formed in the unevenness portion 210 and the metal sheet 216 formed in the flattened portion 220 may be integrally formed with each other or may be monolithic. Accordingly, the metal sheet 216 may be formed in an overall window frame shape to correspond to an overall shape of the apron 200.

The apron 200 having the metal sheet 216 disposed therein may be easily manufactured, for example, via insert injection. Integrally molding the metal sheet 216 and the apron 200 via insert injection may allow the manufacturing cost of the display apparatus to be reduced.

The metal sheet 216 may be received in the apron 200 to reinforce the rigidity of the apron 200. Further, since the metal sheet 216 is made of a metal material with a high elastic restoring force, the metal sheet 216 may play a role in stably maintaining an unfolded state when the display portion 100 is exposed to the outside of the housing 20 and is unfolded.

Figure 7:
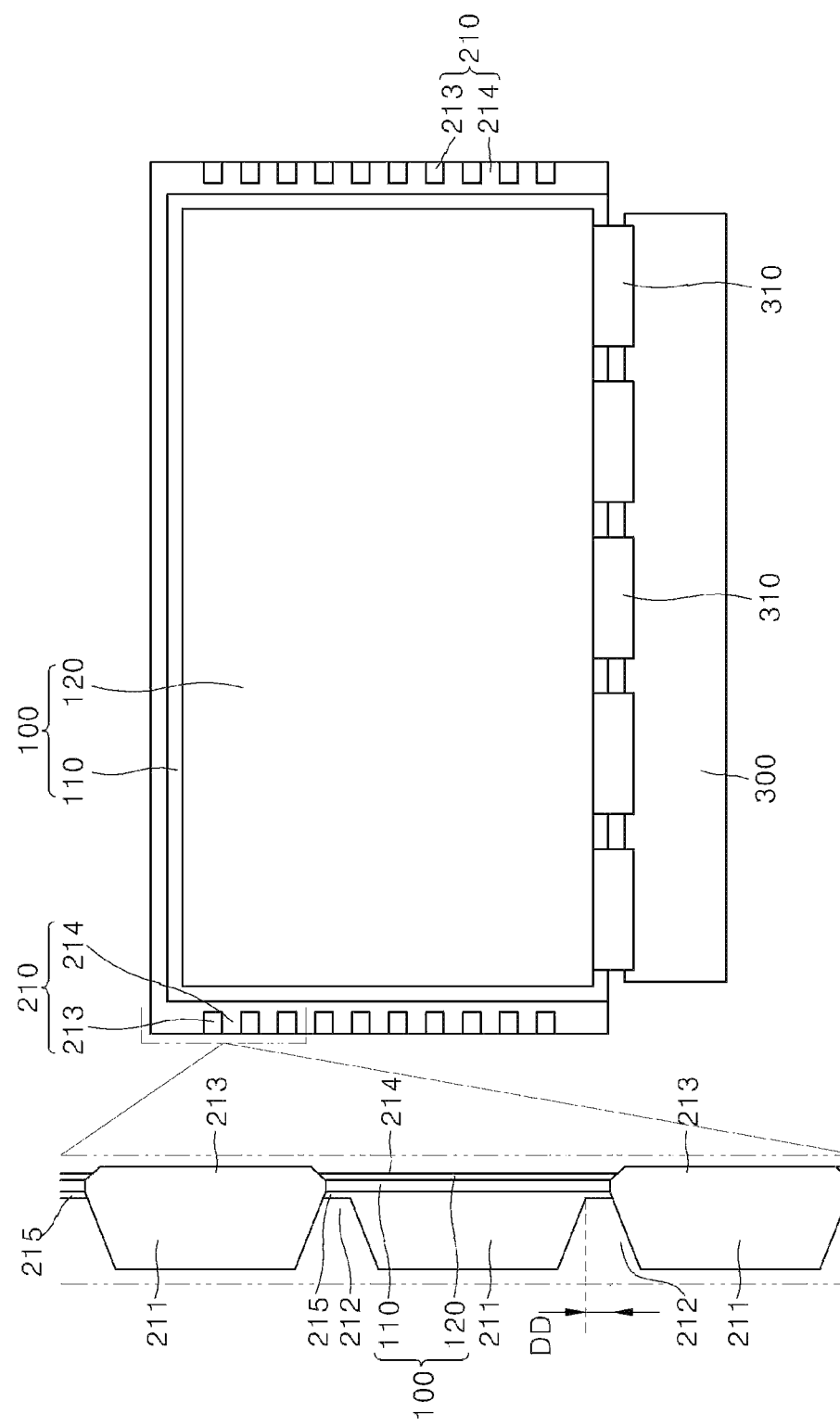
FIG. 7 is a rear view of a display module according to an embodiment.
Figure 8:
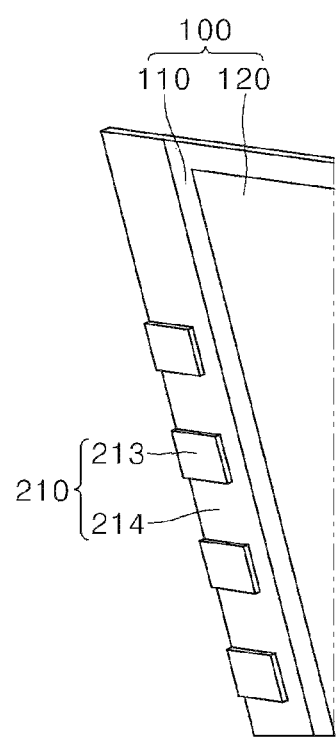
FIG. 8 is an enlarged view of a portion of a rear face of a display module according to one embodiment.

FIG. 7 is a rear view of the display module 10 according to an embodiment. FIG. 8 is an enlarged view of a portion of a rear face of the display module 10 according to an embodiment.

The unevenness portion 210 may include second protrusions 213 and second recesses 214 on a rear surface of the apron 200. The second protrusion 213 may protrude in a rearward direction of the display portion 100. A plurality of the second protrusions 213 may be arranged in the first direction. The second recess 214 may be disposed between adjacent ones of the plurality of the second protrusions 213 so as to space the adjacent ones of the plurality of the second protrusion 213 from each other. In this regard, the second protrusion 213 may have a thickness smaller than that of the first protrusion 211.

Since the second protrusion 213 constitutes a rear face of the unevenness portion 210 and protrudes in the rearward direction, it is necessary to allow the cover 110 attached to the rear face of the unevenness portion 210 to bypass the second protrusion 213. Accordingly, the second protrusion 213 may constitute an outer portion of the unevenness portion 210 so as not to overlap the cover 110 disposed on an inner portion of the rear face of the unevenness portion 210.

In one example, the first protrusion 211 constitutes the front face of the unevenness portion 210 and protrudes in the frontward. Thus, the first protrusion 211 may be constructed to overlap the cover 110 attached to the rear face of the first unevenness portion 210 in the third direction (x-direction). Accordingly, in order to prevent the second protrusion 213 from overlapping the cover 110 in the third direction, a width of the second protrusion 213 may be smaller than a width of the first protrusion 211.

The second protrusion 213 may constitute the rear face of the apron 200 and protrude in the rearward direction, that is, in the opposite direction to the direction in which the first protrusion 211 protrudes. Thus, the second protrusion 213 together with the first protrusion 211 may reinforce the rigidity of the apron 200. That is, the second protrusion 213 may increase the thickness of the apron 200, so that even when the apron 200 is repeatedly deformed, the second protrusion may serve to reinforce the rigidity of the apron 200 so as not to be damaged.

The second protrusions 213 of the unevenness portion 210 adjacent to each other may be spaced apart from each other. The first protrusion 211 may be disposed at a position corresponding to a position between the second protrusions 213 adjacent to each other. Further, the second protrusions 213 and the second recesses 214 may be alternately arranged with each other in the first direction.

In this connection, only the first protrusion 211 may be present but the second protrusion 213 may be absent at a first position between adjacent second positions. In this connection, the second position refers to a position at which both the first protrusion 211 and the second protrusion 213 are present. Accordingly, the number of the first protrusions 211 may be approximately twice the number of the second protrusions 213.

When the number of the second protrusions 213 is large or the thickness thereof is larger, the smooth bending of the apron 200 may be inhibited. Therefore, the number of the second protrusions 213 may be less than that of the first protrusions 211 and the second protrusion may be constructed to have a smaller thickness than that of the first protrusion 211. Thus, the apron 200 may be smoothly bent while the rigidity of the apron 200 is reinforced at the same time.

In an embodiment, the rigidity of the apron 200 may be enhanced by the first protrusions 211, the second protrusions 213, and the metal sheet 216. Therefore, even when the apron 200 is repeatedly bent, damage thereto is suppressed due to this reinforcing structure. Thus, durability of the display apparatus may be improved.

Figure 9:
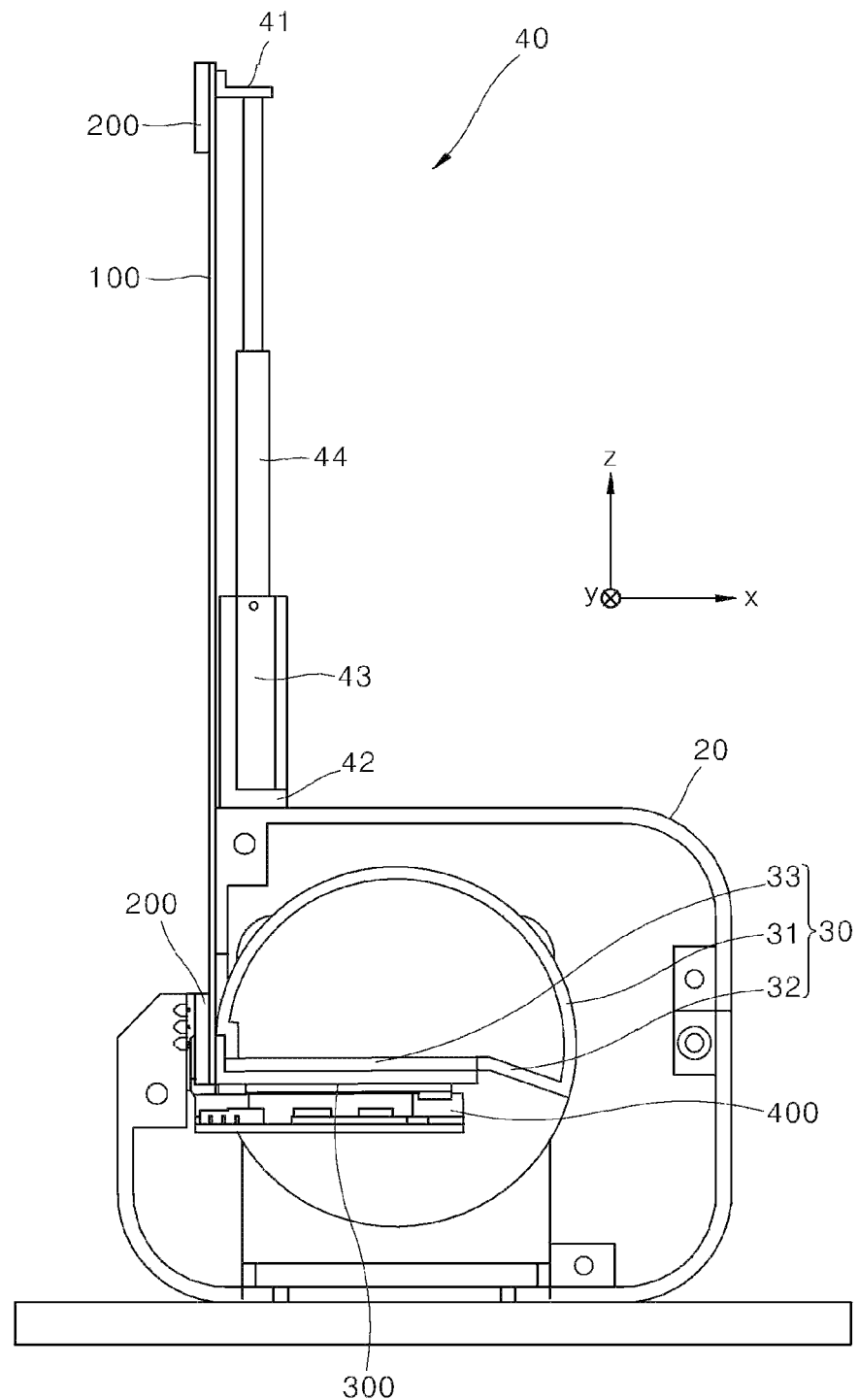
FIG. 9 is a side cross-sectional view of a display apparatus according to an embodiment.
Figure 10:
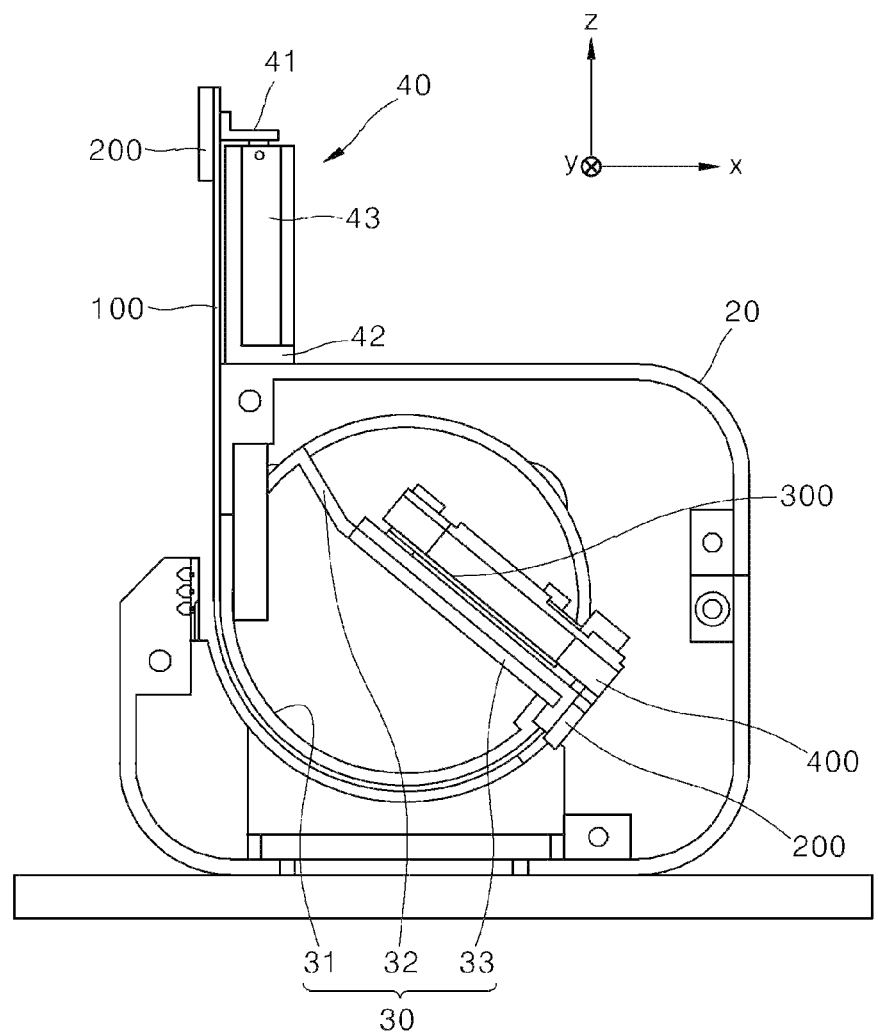
FIG. 10 is a view showing a state in which a portion of a display portion and a portion of an apron in FIG. 9 are accommodated in a housing according to an embodiment.

FIG. 9 is a side cross-sectional view of a display apparatus according to an embodiment. FIG. 10 is a view showing the state in which a portion of each of the display portion 100 and the apron 200 in FIG. 9 is accommodated in the housing 20.

The display apparatus according to embodiment may include the display module 10, the housing 20, the rolling guide 30, a guider 40, and a motor. The display module 10 is the same as described above.

The housing 20 may accommodate at least a portion of the display module 10. For example, the housing 20 may be embedded in a dashboard of the vehicle. In this regard, each of the display portion 100 and the apron 200 may be constructed such that at least a portion thereof is exposed out of the dashboard. In one example, a size of an area of the display portion 100 and a size of an area of the apron 200 as accommodated in the housing 20 may be different from each other.

Referring to FIG. 9, when the display portion 100 and the apron 200 move up, the portion thereof which has been accommodated in the housing 20 in the bent state is unfolded again so to be exposed out of the housing 20. Thus, the user views an image or video reproduced on the unfolded portion of the display portion 100.

Referring to FIG. 10, when the display portion 100 and the apron 200 move downwards, at least a portion of the display portion 100 and at a least portion of the apron 200 are bent and deformed into a curved shape when viewed from a side so to be accommodated in the housing 20.

The rolling guide 30 may be accommodated in the housing 20 and may be constructed to rotate with respect to the housing 20. The rolling guide 30 may be constructed such that the display module 10 is mounted thereon, and at least a portion of each of the display portion 100 and the apron 200 is wound around the rolling guide.

The guider 40 has one end mounted on the apron 200 and the other end mounted on the housing 20. The guider 40 may move the display portion 100 and the apron 200 in the first direction to change the areas of the display portion 100 and the apron 200 as exposed out of the housing.

The guider 40 may include a first bracket 41, a second bracket 42, a third bracket 43, and a movable portion 44. The first bracket 41 may be coupled to the apron 200 and move together with the apron 200. The first bracket 41 may have a bar shape and may have a length direction parallel to the second direction, and may be coupled to a top of the rear face of the apron 200.

The first bracket 41 is constructed to move up or down along with the display apparatus. As the first bracket 41 moves up or down, the apron 200 and the display portion 100 coupled thereto move up or down, so that an exposed area thereof may vary.

The second bracket 42 may be coupled to the housing 20. The second bracket 42 may have a bar shape, and a length direction parallel to the second direction and may be coupled to the housing 20. The housing 20 may support the second bracket 42.

The third bracket 43 may be formed to protrude upward from the second bracket 42. The third bracket 43 may be embodied as a pair in which the third brackets 43 may be disposed to be spaced apart from each other by a predetermined distance in the second direction. A hollow portion in which the movable portion 44 is mounted may be formed in the third bracket 43.

The guider 40 may further include a reinforcement plate. The reinforcement plate is disposed between the pair of third brackets 43 that are spaced apart from each other, and is coupled thereto. Thus, the reinforcement plate may serve to maintain a designed separation distance between the pair of third brackets 43. The reinforcement plate may be formed in a plate shape and may be manufactured integrally with the pair of third brackets 43. However, the reinforcement plate is not an essential component of the display apparatus.

In one example, the second bracket 42, the third bracket 43 and the reinforcement plate may be integrally manufactured with each other. However, the disclosure is not limited thereto.

The movable portion 44 may be constructed such that one end thereof is coupled to the first bracket 41 and is inserted into the third bracket 43 so as to be movable in the first direction with respect to the third bracket 43. The movable portion 44 may be inserted into the hollow of the third bracket 43 so as to move up and down with respect to the third bracket 43.

Accordingly, as the movable portion 44 moves up and down, the first bracket 41, the apron 200 coupled thereto, and the display portion 100 coupled to the apron 200 move up and down, and accordingly, the exposed area of each of the apron 200 and the display portion 100 may vary.

The movable portion 44 may support the display portion 100 and the apron 200 so that the exposed portions of the display portion 100 and the apron 200 maintain a linear state while the display portion 100 and the apron 200 is ascending and descending.

The motor may be configured to allow the movable portion to move up or down the display portion 100 and the apron 200. Further, the movable portion 44 may be raised and lowered under an operation of the motor. The motor may be coupled to the housing 20, and a rotating shaft thereof may be coupled to the rolling guide 30.

When the motor rotates, the rolling guide 30 rotates, and accordingly the display portion 100 and the apron 200 may be wound or unwound around the rolling guide 30.

Referring to FIG. 9, when the motor rotates in a direction in which the display portion 100 and the apron 200 are unwound from the rolling guide 30, a top of each of the display portion 100 and the apron 200 moves up, thereby increasing the exposed areas thereof. At this time, the movable portion 44 coupled to the apron 200 may move up.

Referring to FIG. 10, when the motor rotates in a direction in which the display portion 100 and the apron 200 are wound around the rolling guide 30, the top of each of the display portion 100 and the apron 200 descends, thereby reducing the exposed area thereof. At this time, the movable portion 44 coupled to the apron 200 may move down.

Hereinafter, the rolling guide 30 will be described in more detail. The rolling guide 30 may include a curved portion 31, a bridge 32 and a rib 33. The display portion 100 and the apron 200 may be wound around the curved portion 31 on an outer circumferential face thereof. The curved portion 31 may be formed in, for example, a circular arc.

The curved portion 31 may be embodied as a pair, wherein two curved portions may be spaced apart from each other in the second direction of the display portion 100. In this regard, the rib 33 may be disposed between the pair of curved portions 31.

As the motor operates and thus the rolling guide 30 rotates, an area by which each of the display portion 100 and the apron 200 is wound around the curved portion 31 may vary. As shown in FIG. 9, when the top of each of the display portion 100 and the apron 200 reaches a designed highest vertical level and thus the display portion 100 is fully unfolded, there may be no or very small area by which each of the display portion 100 and the apron 200 is wound around the curved portion 31.

Conversely, as shown in FIG. 10, when the rolling guide 30 rotates and thus the top of each of the display portion 100 and the apron 200 reaches a designed lowest vertical level, an area by which each of the display portion 100 and the apron 200 is wound around the curved portion 31 may be the maximum.

The bridge 32 may connect both ends of the curved portion 31 to each other. As in the curved portion 31, the bridge 32 may be embodied as a pair. The curved portion 31 and the bridge 32 may be integrally formed with each other. The disclosure is not limited thereto. The bridge 32 may be formed approximately in a plate shape, and both ends of the rib 33 may be respectively coupled to the pair of bridges 32.

The rib 33 may be coupled to the bridge 32. The printed circuit board 300 and the bracket 400 may be mounted on the rib. The rib may be coupled to a bottom portion of the apron 200. The rib 33 may be formed in a generally plate-like shape.

The bracket 400 may be coupled to the rib 33 via a coupling mechanism such as a screw bolt. According to an embodiment, each of the printed circuit board 300 and the bracket 400 on which the printed circuit board 300 is mounted may have a length direction parallel to the second direction of the display portion 100.

Accordingly, the rib 33 may be formed to have a length direction parallel to the second direction of the display portion 100 and thus may have a shape corresponding to a shape of the bracket 400. Due to this structure, the rolling guide 30 may provide a sufficient space in which the printed circuit board 300 is placed.

The bracket 400 on which the printed circuit board 300 has been mounted may be attached to the rib 33. The printed circuit board 300 may be coupled to the bracket 400 and, in this state, may be mounted on the rib 33, and thus may be constructed to rotate together with the rotation of the rolling guide 30.

A display apparatus according to an embodiment of the present disclosure may be described as follows.

A first aspect of the present disclosure provides a display apparatus comprising: a display portion constructed such that at least a portion thereof is deformable; and an apron constructed such that at least a portion thereof is deformable, wherein the apron has a hollow space, surrounds an edge of the display portion, and is coupled to the display portion, wherein the apron has an unevenness portion disposed at a position corresponding to a position of each of both opposing edges of the display portion.

In one implementation of the first aspect, the display portion includes: a cover; and a display panel attached to the cover rear face and displaying an image, wherein the apron is disposed on an edge of the display portion and is attached to a front face of the cover.

In one implementation of the first aspect, the unevenness portion includes: a plurality of first protrusions arranged in a first direction, wherein each first protrusion protrudes in a frontward direction of the display portion; and a plurality of first recesses, wherein each first recess is disposed between adjacent ones of the plurality of the first protrusions, and spaces the adjacent ones of the plurality of the first protrusions from each other.

In one implementation of the first aspect, the adjacent ones of the first protrusions are spaced from each other by a predefined spacing.

In one implementation of the first aspect, the unevenness portion includes: a plurality of second protrusions arranged in the first direction, wherein each second protrusion protrudes in a rearward direction of the display portion; and a plurality of second recesses, wherein each second recess is disposed between adjacent ones of the plurality of the second protrusions, and spaces the adjacent ones of the plurality of the second protrusions from each other.

In one implementation of the first aspect, the adjacent ones of the second protrusions are spaced from each other by a predefined spacing, wherein the first protrusion is disposed at a position corresponding to a position between the second protrusions adjacent to each other.

In one implementation of the first aspect, the second protrusions and the second recesses are alternately arranged with each other, wherein the single second protrusion and the single second recess are disposed at position corresponding to a position of the first protrusion.

In one implementation of the first aspect, the unevenness portion includes a connection cell for connecting the adjacent ones of the plurality of first protrusions to each other.

In one implementation of the first aspect, the unevenness portion includes a pair of unevenness portions respectively disposed at positions corresponding to positions of both opposite edges of the display portion, wherein each unevenness portion extends in a direction parallel to the first direction.

In one implementation of the first aspect, the unevenness portion further includes a metal sheet received therein, wherein the metal sheet extends along the first direction.

In one implementation of the first aspect, the apron includes a pair of flattened portions respectively disposed at positions corresponding to both opposite edges of the display portion spaced from each other in the first direction, wherein each of the flattened portions extends in a second direction orthogonal to the first direction, wherein each of the flattened portions includes a metal sheet received therein.

A second aspect of the present disclosure provides a display apparatus comprising: a display portion constructed such that at least a portion thereof is deformable; an apron constructed such that at least a portion thereof is deformable, wherein the apron has a hollow space, surrounds an edge of the display portion, and is coupled to the display portion, wherein the apron includes: a pair of unevenness portions respectively disposed at positions corresponding to positions of both opposing edges of the display portion spaced from each other in a second direction, wherein each of the unevenness portions extends in a first direction orthogonal to the second direction; and a pair of flattened portions respectively disposed at upper and lower edges of the display portion, wherein each of the flattened portions extends in the second direction orthogonal to the first direction.

In one implementation of the second aspect, the unevenness portion includes: a plurality of first protrusions arranged in the first direction, wherein each first protrusion protrudes in a frontward direction of the display portion; and a plurality of first recesses, wherein each first recess is disposed between adjacent ones of the plurality of the first protrusions, and spaces the adjacent ones of the plurality of the first protrusions from each other, wherein the adjacent ones of the first protrusions are spaced from each other by a predefined spacing.

In one implementation of the second aspect, the unevenness portion includes: a plurality of second protrusions arranged in the first direction, wherein each second protrusion protrudes in a rearward direction of the display portion; and a plurality of second recesses, wherein each second recess is disposed between adjacent ones of the plurality of the second protrusions, and spaces the adjacent ones of the plurality of the second protrusions from each other, wherein the adjacent ones of the second protrusions are spaced from each other by a predefined spacing, wherein the first protrusion is disposed at a position corresponding to a position between the second protrusions adjacent to each other.

In one implementation of the second aspect, each of the flattened portion and the unevenness portion further includes a metal sheet received therein.

The present disclosure as described above is not limited to the above-described embodiments and the accompanying drawings. It will be apparent to those of ordinary skill in the technical field to which the present disclosure belongs that various substitutions, modifications and changes may be made within the scope not departing from the technical ideas of the present disclosure. Therefore, the scope of the present disclosure is indicated by the following claims, and all changes or modifications derived from the meaning and scope of the claims and their equivalent concepts should be construed as being included in the scope of the present disclosure.

What is claimed is:

1. A display apparatus comprising:
   a display portion comprising at least a portion that is deformable; and
   an apron comprising at least a portion that is deformable and a hollow space, the display portion disposed in the hollow space such that the apron surrounds an edge of the display portion,
   wherein the portion of the apron that is deformable has an unevenness portion in a surface of the apron, the unevenness portion disposed at positions of the apron corresponding to positions of opposing edges of the display portion, and
   wherein the display portion includes:
      a cover; and
      a display panel attached to a rear face of the cover, the display panel configured to display an image,
         wherein the apron is disposed on an edge of the display portion and is attached to a front face of the cover that is opposite the rear face of the cover.

2. The display apparatus of claim 1, wherein the unevenness portion includes:
   a plurality of first protrusions arranged in a first direction, wherein each of the plurality of first protrusions protrudes in a frontward direction of the display portion; and
   a plurality of first recesses, wherein each of the plurality of first recesses is disposed between adjacent ones of the plurality of the first protrusions, and spaces the adjacent ones of the plurality of the first protrusions from each other.

3. The display apparatus of claim 2, wherein the adjacent ones of the plurality of first protrusions are spaced from each other by a predefined spacing.

4. The display apparatus of claim 2, wherein the unevenness portion includes:
   a plurality of second protrusions arranged in the first direction, wherein each of the plurality of second protrusions protrudes in a rearward direction of the display portion; and
   a plurality of second recesses, wherein each of the plurality of second recesses is disposed between adjacent ones of the plurality of the second protrusions, and spaces the adjacent ones of the plurality of the second protrusions from each other.

5. The display apparatus of claim 4, wherein the adjacent ones of the plurality of second protrusions are spaced from each other by a predefined spacing,
   wherein a first protrusion from the plurality of first protrusions is disposed at a position corresponding to a position between second protrusions from the plurality of second protrusions that are adjacent to each other.

6. The display apparatus of claim 4, wherein the plurality of second protrusions and the plurality of second recesses are alternately arranged with each other, wherein a single second protrusion from the plurality of second protrusions and a single second recess from the plurality of second recesses are disposed at a position corresponding to a position of a first protrusion from the plurality of first protrusions.

7. The display apparatus of claim 3, wherein the unevenness portion includes a connection cell for connecting the adjacent ones of the plurality of first protrusions to each other.

8. The display apparatus of claim 2, wherein the unevenness portion includes a pair of unevenness portions respectively disposed at positions corresponding to positions of both opposing edges of the display portion, wherein each unevenness portion from the pair extends in a direction parallel to the first direction.

9. The display apparatus of claim 8, wherein the unevenness portion further includes a metal sheet, wherein the metal sheet extends along the first direction.

10. The display apparatus of claim 9, wherein the apron includes a pair of flattened portions respectively disposed at positions corresponding to both of the opposing edges of the display portion spaced from each other in the first direction, wherein each of the flattened portions from the pair extends in a second direction orthogonal to the first direction,
    wherein each of the flattened portions from the pair includes a metal sheet.

11. A display apparatus comprising:
    a display portion comprising at least a portion that is deformable; and
    an apron comprising at least a portion that is deformable and a hollow space, the display portion disposed in the hollow space such that the apron surrounds an edge of the display portion,
    wherein the apron includes:
    a pair of unevenness portions respectively disposed at positions of a surface of the apron corresponding to positions of both opposing edges of the display portion, the pair of unevenness portions spaced apart from each other in a second direction, wherein each of the unevenness portions from the pair extends in a first direction orthogonal that is to the second direction; and
    wherein at least one unevenness portion from the pair of unevenness portions includes:
       a plurality of second protrusions arranged in the first direction, wherein each of the plurality of second protrusions protrudes in a rearward direction of the display portion that is opposite the frontward direction; and
       a plurality of second recesses, wherein each of the plurality of second recesses is disposed between adjacent ones of the plurality of the second protrusions, and spaces the adjacent ones of the plurality of the second protrusions from each other.

12. The display apparatus of claim 11, wherein at least one unevenness portion from the pair of unevenness portions includes:

a plurality of first protrusions arranged in the first direction, wherein each of the plurality of first protrusion protrudes in a frontward direction of the display portion; and a plurality of first recesses, wherein each of the plurality of first recesses is disposed between adjacent ones of the plurality of the first protrusions, and spaces apart the adjacent ones of the plurality of the first protrusions from each other, wherein the adjacent ones of the plurality of first protrusions are spaced from each other by a predefined spacing.

13. The display apparatus of claim 12, wherein the adjacent ones of the plurality of second protrusions are spaced from each other by a predefined spacing, wherein a first protrusion from the plurality of first protrusions is disposed at a position corresponding to a position between second protrusions from the plurality of second protrusions that are adjacent to each other.

14. The display apparatus of claim 11, wherein the apron includes:

a pair of flattened portions respectively disposed at upper and lower edges of the display portion, wherein each of the flattened portions from the pair of flattened portions extends in the second direction orthogonal to the first direction, and wherein each of the flattened portions from the pair of flattened portions and the unevenness portions from the pair of unevenness portions further includes a metal sheet.

15. A display apparatus comprising:

an apron including a plurality of first deformable portions disposed on opposite edges of a first surface of the apron that extend in a first direction, each of the plurality of first deformable portions including a plurality of first protrusions that protrude from the first surface of the apron and a plurality of first recesses in the first surface of the apron, each of the plurality of first recesses disposed between a pair of first protrusions from the plurality of first protrusions; and a display portion coupled to the apron, the display portion configured to display an image and including a portion that is configured to deform, wherein the apron further comprises a plurality of second deformable portions disposed on opposite edges of a second surface of the apron that is opposite the first surface, each of the plurality of second deformable portions including a plurality of second protrusions that protrude from the second surface of the apron and a plurality of second recesses in the second surface of the apron, each of the plurality of second recesses disposed between a pair of second protrusions from the plurality of first protrusions.

16. The display apparatus of claim 15, wherein the plurality of first deformable portions overlap the plurality of second deformable portions.

17. The display apparatus of claim 15, wherein the display portion is disposed in a hollow space of the apron and comprises:

a cover; and a display panel attached to a rear surface of the cover, the display panel configured to display the image, wherein the apron is attached to a front surface of the cover that is opposite the rear surface of the cover-glass.

18. The display apparatus of claim 15, wherein the apron further includes a plurality of non-deformable portions disposed on opposite edges of the first surface of the apron that extend in a second direction that is orthogonal from the first direction.

* * * * *